United States Patent
Hwang et al.

(10) Patent No.: US 7,528,486 B2
(45) Date of Patent: May 5, 2009

(54) ANISOTROPIC CONDUCTIVE FILM AND BUMP, AND PACKAGING STRUCTURE OF SEMICONDUCTOR HAVING THE SAME

(75) Inventors: Seong-Yong Hwang, Suwon-si (KR); Weon-Sik Oh, Yongin-si (KR); Ju-Young Yoon, Yongin-si (KR); Sung-Lak Choi, Osan-si (KR); Chun-Ho Song, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/970,360

(22) Filed: Oct. 21, 2004

(65) Prior Publication Data
US 2005/0173785 A1 Aug. 11, 2005

(30) Foreign Application Priority Data
Feb. 5, 2004 (KR) .................. 10-2004-0007646

(51) Int. Cl.
*H01L 23/48* (2006.01)
*H01L 23/52* (2006.01)
*H01L 29/40* (2006.01)
*H01L 23/485* (2006.01)
*H01B 1/22* (2006.01)

(52) U.S. Cl. ................ 257/737; 257/E23.021; 252/514

(58) Field of Classification Search .................. None
See application file for complete search history.

(56) References Cited

U.S. PATENT DOCUMENTS

| 5,804,882 | A | * | 9/1998 | Tsukagoshi et al. | 257/783 |
| 5,903,056 | A | * | 5/1999 | Canning et al. | 257/773 |
| 5,965,064 | A | * | 10/1999 | Yamada et al. | 252/512 |
| 6,344,156 | B1 | * | 2/2002 | Yamada et al. | 252/512 |
| 2002/0014615 | A1 | * | 2/2002 | Yamada et al. | 252/500 |
| 2005/0157244 | A1 | * | 7/2005 | Hwang et al. | 349/151 |

\* cited by examiner

*Primary Examiner*—Andy Huynh
*Assistant Examiner*—Hoang-Quan T Ho
(74) *Attorney, Agent, or Firm*—F. Chau & Associates, LLC

(57) ABSTRACT

In an anisotropic conductive film including conductive particles, and a bump, and a packaging structure of a semiconductor chip having the anisotropic conductive film and the bump, the anisotropic conductive film includes a resin layer and the conductive particles. The anisotropic conductive film electrically connects an electrode of a substrate and the bump of a semiconductor chip. A volume ratio of the conductive particles to the resin layer is about 0.1 to about 0.12. A number of the conductive particles per cubic millimeter ($mm^3$) is about 4 millions to about 7 millions. A standard deviation of heights of the bumps is no more than about 0.25. An interval between each of the bumps and an electrode of the substrate is no more than about 1.3 μm. Therefore, the size of each of the conductive particles is optimized so that a failure probability of the open circuit is decreased.

15 Claims, 7 Drawing Sheets

N CONDUCTIVE PARTICLES

μ CONDUCTIVE PARTICLES

ANISOTROPIC CONDUCTIVE FILM AND BUMP, AND PACKAGING STRUCTURE OF SEMICONDUCTOR HAVING THE SAME

CROSS-REFERENCE TO RELATED APPLICATION

This application relies for priority upon Korean Patent Application No. 2004-07646 filed on Feb. 5, 2004, the contents of which are herein incorporated by reference in its entirety (their entireties).

BACKGROUND OF THE INVENTION

1. Field of the Invention

The present invention relates to an anisotropic conductive film, and a bump and a packaging structure of a semiconductor having the anisotropic conductive film and the conductive bump, and more particularly to an anisotropic conductive film including conductive particles having optimized size, and a bump having an optimized size that corresponds to that of the conductive particles, and a packaging structure of a semiconductor having the anisotropic conductive film and the conductive bump.

2. Description of the Related Art

Electrical devices such as a mobile communication terminal, a digital camera, a notebook computer, etc., have various display apparatuses. The display apparatuses may be flat panel display apparatuses. Examples of the flat panel display apparatuses include a liquid crystal display (LCD) apparatus.

A conventional LCD apparatus includes an LCD panel having an array substrate, a color filter substrate and a liquid crystal layer formed between the array substrate and the color filter substrate. A driving integrated circuit (IC) is formed on the array substrate.

The driving IC of a chip on glass (COG) type LCD apparatus is directly formed on the LCD panel.

An anisotropic conductive film (ACF) is formed on electrode pads of the LCD panel of the COG type LCD apparatus, and the driving IC is compressed on the electrode pads. The ACF film includes a resin layer and conductive particles in the resin layer. The bumps under the driving IC or a semiconductor chip are electrically connected to the electrode pads through the conductive particles.

FIG. 1 is a cross-sectional view showing a conventional COG type LCD apparatus having an ACF.

Referring to FIG. 1, an ACF 30 electrically and mechanically connects electrode pads 12 of an array substrate 10 to bumps 22 of a semiconductor chip 20.

When an image display quality of the LCD apparatus is enhanced, a distance between the electrode pads is decreased. The distance between the electrode pads is a pitch. Therefore, an area of each of the bumps 22 of the semiconductor chip 20 is also decreased.

BRIEF SUMMARY OF THE INVENTION

The present invention provides an anisotropic conductive film including conductive particles having an optimized size.

The present invention provides a bump having an optimized size that corresponds to that of the conductive particles.

The present invention provides a packaging structure of a semiconductor having the anisotropic conductive film and the conductive bump.

In one aspect of the present invention, an anisotropic conductive film includes a resin layer and a plurality of conductive particles. The anisotropic conductive film electrically connects an electrode of a substrate and a bump of a semiconductor chip. The conductive particles are in the resin layer. A volume ratio of the conductive particles with respect to the resin layer is about 0.1 to about 0.12. A number of the conductive particles per cubic millimeter ($mm^3$) is about 4 millions to about 7 millions.

In another aspect of the present invention, bumps of a semiconductor chip are electrically connected to a substrate by an anisotropic conductive film. A standard deviation of heights of the bumps is no more than about 0.25. An interval between each of the bumps and an electrode of the substrate is no more than about 1.3 μum.

In still another aspect of the present invention, a packaging structure of a semiconductor includes a semiconductor chip, a substrate and an anisotropic conductive film. The semiconductor chip has a bump. The substrate has an electrode. The anisotropic conductive film includes a plurality of conductive particles to electrically connect the bump and the electrode. A number of the conductive particles per cubic millimeter ($mm^3$) is about 4 millions to about 7 millions with respect to a failure probability of an open circuit between the bump and the electrode.

According to the anisotropic conductive film, the bump and the packaging structure for the semiconductor device having the same, the density of the conductive particles, a size of each of the conductive particles, the difference of the heights of the bumps and conditions of compressing the electrodes and the bumps are optimized so that the failures of the open circuit is decreased.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
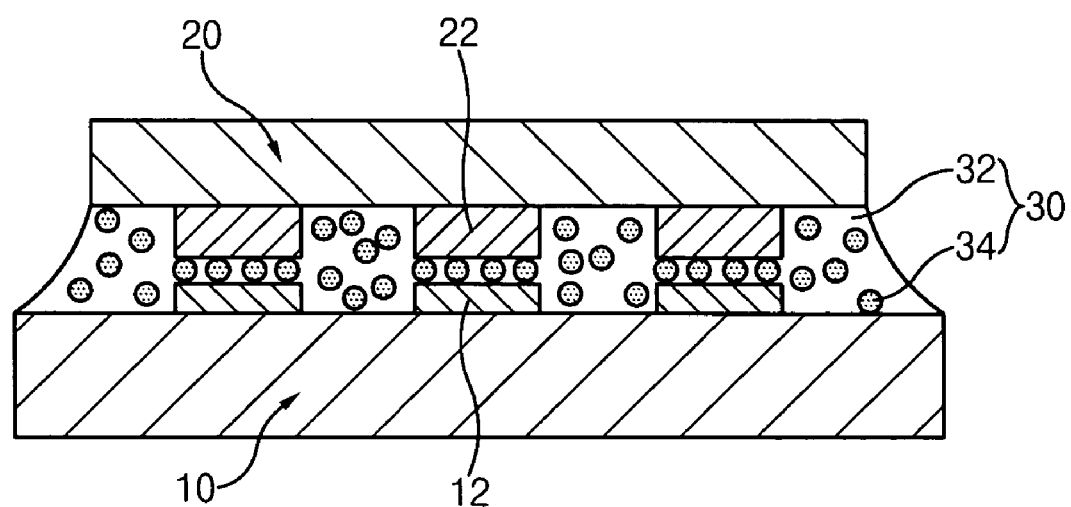
FIG. 1 is a cross-sectional view showing a conventional COG type LCD apparatus having an ACF.
Figure 2A:
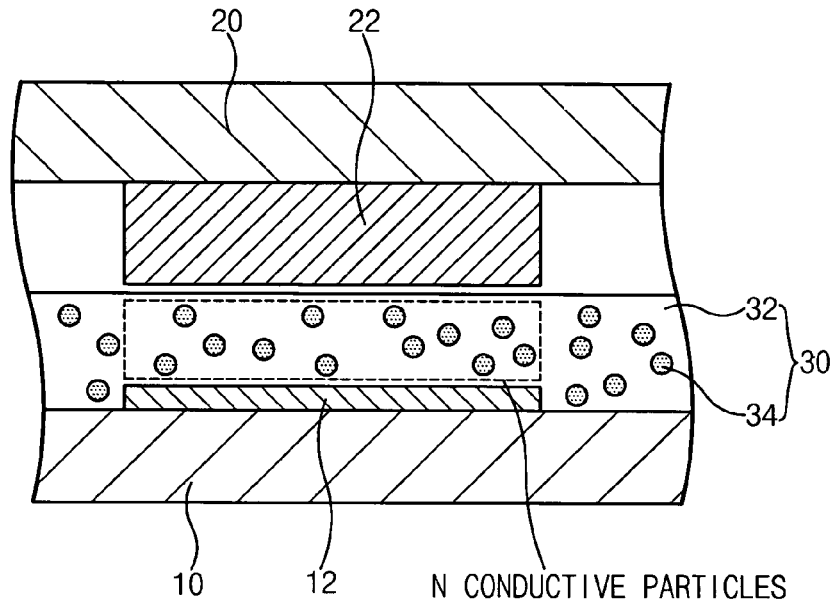
FIG. 2A is a cross-sectional view illustrating a distribution of conductive particles disposed between an electrode and a bump before compressing the electrode and the bump.
Figure 2B:
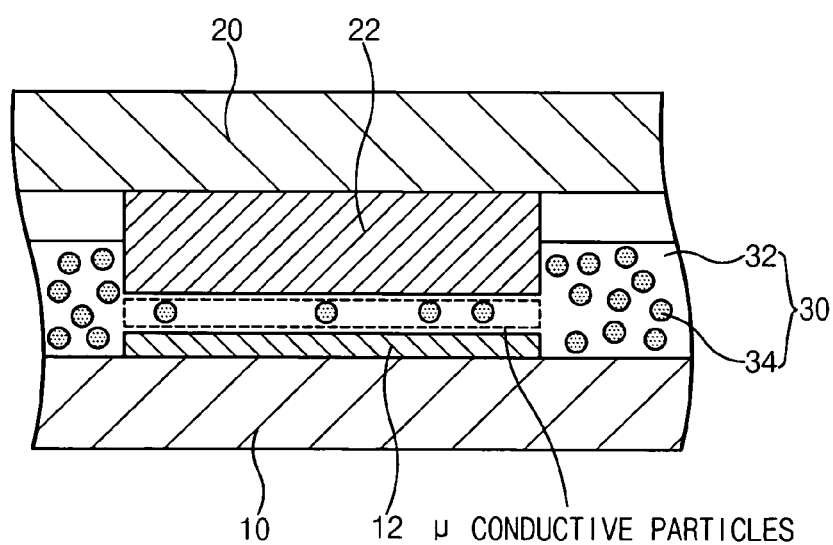
FIG. 2B is a cross-sectional view illustrating a distribution of conductive particles disposed between an electrode and a bump after compressing the electrode and the bump.

FIG. 2A is a cross-sectional view illustrating a distribution of conductive particles disposed between an electrode and a bump before compressing the electrode and the bump. FIG. 2B is a cross-sectional view illustrating a distribution of conductive particles disposed between an electrode and a bump after compressing the electrode and the bump.

Referring to FIG. 2A, N (wherein N is a positive integer) conductive particles 34 are disposed between the bump 22 and the electrode 12 prior to a main bonding. The semiconductor chip 20 is combined with a substrate 10 through the main bonding.

Alternatively, the conductive particles may have a cubic shape.

That is, the N conductive particles 34 are disposed in an area A where the bump 22 is overlapped with the electrode 12, before the electrode 12 of the substrate 10 is combined with the bump 22 of the semiconductor chip 20.

An anisotropic conductive film (ACF) and a resin layer are represented by reference numerals 30 and 32, respectively.

Each of the conductive particles 34 has a metal particle, a plastic particle having a metal layer on an outer surface of the plastic particle or a metal particle having an insulating layer on an outer surface of the metal particle. The metal particle includes nickel (Ni), solder, gold (Ag), etc. The metal layer formed on the plastic particle includes nickel-silver alloy. The nickel-silver alloy may be plated on the outer surface of the plastic particle. The plastic particle may include polystyrene resin, epoxy resin, etc.

Referring to FIG. 2B, $\mu$ (wherein $\mu$ is a positive integer) conductive particles 34 are disposed between the bump 22 and the electrode 12 after the main bonding is performed.

That is, the $\mu$ conductive particles 34 are disposed in the area A where the bump 22 is overlapped with the electrode 12, after the electrode 12 of the substrate 10 makes contact with the bump 22 of the semiconductor chip 20. When the bump 22 makes contact with the electrode 12, a volume of the resin layer having the conductive particle 34 is decreased so that the number $\mu$ of the conductive particles 34 after the main bonding is smaller than the number N of the conductive particles 34 prior to the main bonding.

The distribution of conductive particles satisfies the following equation 1 as a binomial distribution P(x). Capture ratio p is a ratio of the number N to the number $\mu$. The N conductive particles are disposed in the area A where the bump 22 is overlapped with the electrode 12, before the main bonding. The $\mu$ conductive particles are disposed in the area A where the bump 22 is overlapped with the electrode 12, after the main bonding. x (wherein x denotes a positive number) conductive particles are captured between the bump 22 and the electrode 12, after performing the main bonding.

$$P(x) = {}_NC_x p^x (1-p)^{N-x} \quad \text{Equation 1}$$

When no conductive particle is in the area A where the bump 22 is overlapped with the electrode 12, the bump 22 is electrically disconnected from the electrode 12 to form an open circuit. A failure of the open circuit satisfies the following equation 2 as a binomial distribution P(0).

$$P(0) = (1-p)^N \quad \text{Equation 2}$$

The number of the conductive particles N, the area A of the bump 22 corresponding to the ACF 30, a thickness t of the ACF 30, cubature ratio f of conductive particles 30 in the ACF layer 30, and a diameter d0 of the conductive particles satisfy the following equation 3.

$$N = Atf / [\tfrac{4}{3}\pi (d0/2)^3] \quad \text{Equation 3}$$

Following equation 4 is obtained from the equation 2 combined with the equation 3.

$$P(0) = (1-p)^{Atf/[\{4/3\pi(d0/2)^3\}]} \quad \text{Equation 4}$$

Figure 3:
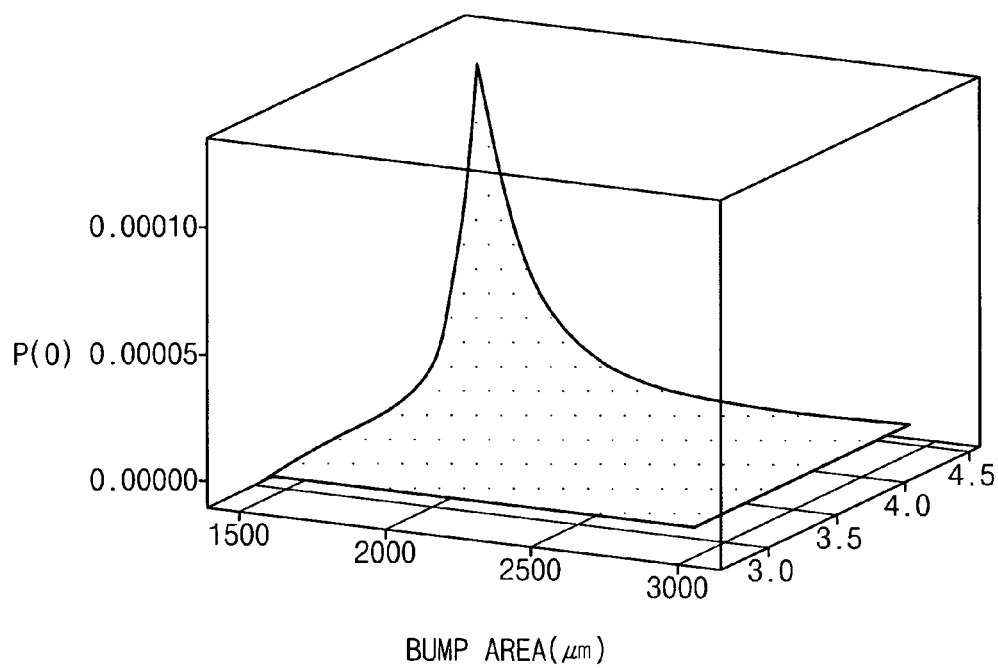
FIG. 3 is a graph showing a relationship among a failure probability of an open circuit, a diameter of each of conductive particles and an area of a bump.

FIG. 3 is a graph showing a relationship among a failure probability of an open circuit, a diameter of each of conductive particles and an area of a bump. The x axis, the y axis and the z axis of the graph represent the area of the bump, the diameter of each of the conductive particles and the failure probability of the open circuit. The failure probability of the open circuit is obtained by the equation 4.

f, p and t are 0.1, 0.2, and 12 $\mu$m, respectively. An ACF layer includes a double-layered structure that has a layer of a thickness of about 12 $\mu$m having the conductive particles and another layer having no conductive particle.

Referring to FIG. 3, when d0 is increased and A is decreased, the failure probability of the open circuit is increased.

For example, when d0 and A are about 3.5 $\mu$m and about 2,500 $\mu$m$^2$, respectively, the failure probability of the open circuit is about zero. When d0 and A are about 4.5 $\mu$m and about 1,500 $\mu$m$^2$, respectively, the failure probability of the open circuit is about 0.00010. Therefore, the failure probability of the open circuit is greatly increased.

Alternatively, the semiconductor chip 20 may include a plurality of the bumps 22. Heights of the bumps 22 are different from one another. Distribution of the heights of the bumps 22 is represented by a normal distribution function having a predetermined variance value.

Figure 4:
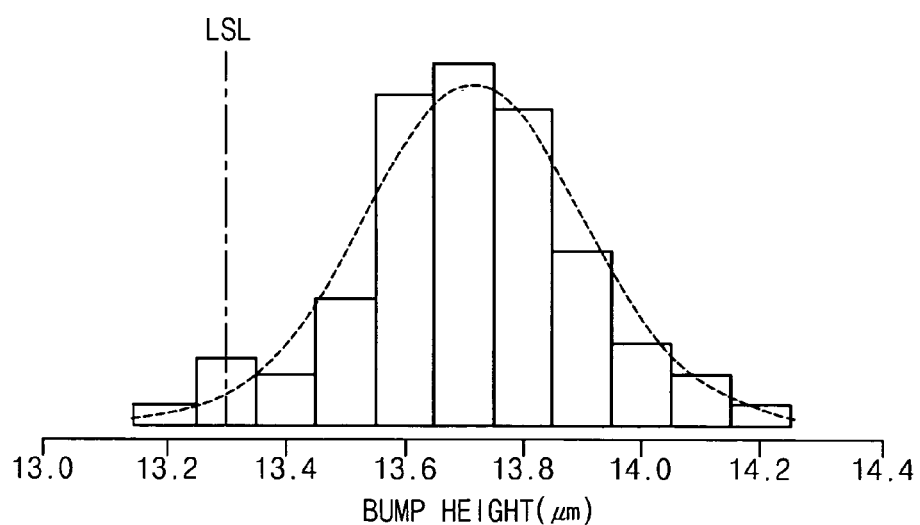
FIG. 4 is a graph showing a relationship between heights of bumps and number of bumps.

FIG. 4 is a graph showing a relationship between heights of bumps and number of bumps. The horizontal axis represents the heights of the bumps, and the vertical axis represents the number of the bumps.

When a height of one of the bumps is more than a lower specification limit (LST), the bump of the semiconductor chip is electrically connected to the electrode through the conductive particles disposed between the bump and the electrode. In the present embodiment, the LST is about 13.3 $\mu$m.

When a height of one of the bumps is less than the lower specification limit (LST) that is about 13.3 $\mu$m, the bump of the semiconductor chip 20 may be electrically disconnected from the electrode 12 via the conductive particles disposed between the bump 22 and the electrode 12.

Figure 5:
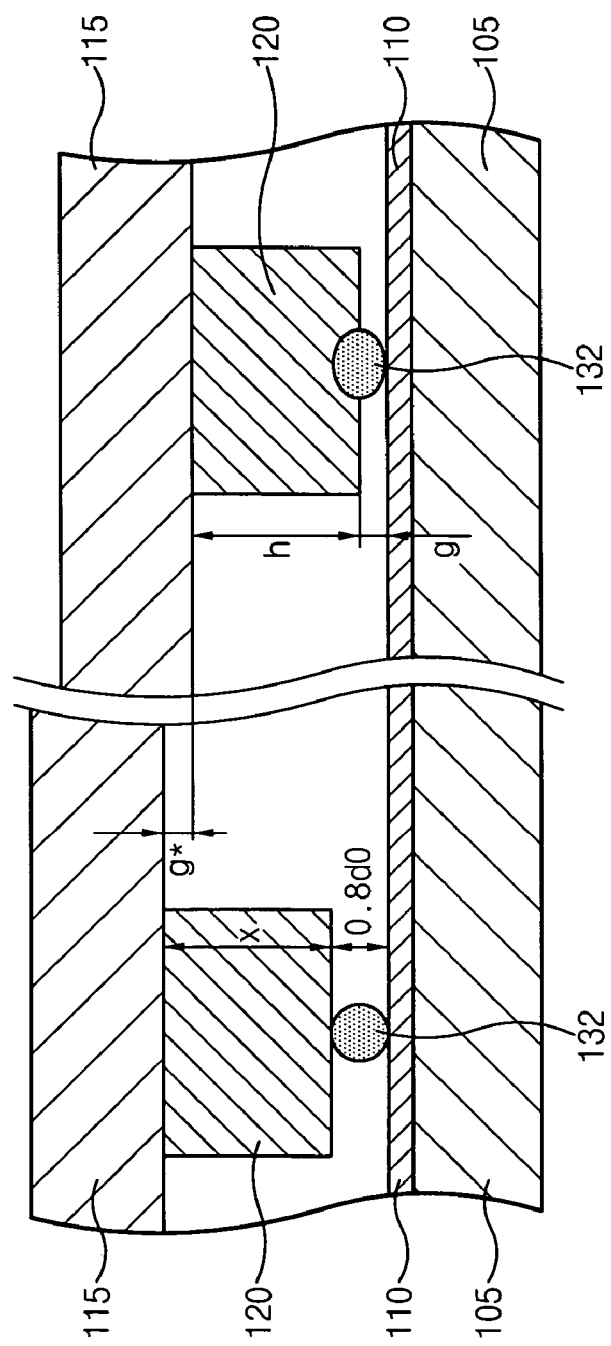
FIG. 5 is a cross-sectional view showing an open circuit caused by difference of heights of bumps.

FIG. 5 is a cross-sectional view showing an open circuit caused by difference of heights of bumps. The bump 120 formed on the semiconductor chip 115 is attached the electrode 110 formed on the substrate 105.

Referring to FIG. 5, x, g, h, g*, and LSL denote the heights of the bumps 120, a mean value of gaps between the bumps 120 and the electrode 110, an arithmetic mean of the heights of the bumps 120, the difference of the heights of the bumps 120 caused by outer factor, and the lower specification limit, respectively. The outer factor may be an impact that is provided from an exterior to the semiconductor chip, a thermal stress, etc. The arithmetic mean of the heights of the bumps 120 is changed by pressure of the main bonding.

The diameter of each of the conductive particles 132 is about 0.8 do (wherein do denotes the initial diameter of the conductive particles 132). The conductive particles 132 are disposed between each of the bumps 120 and the electrode 110 so that each of the bumps 120 is electrically connected to the electrode 110. In order to compensate a deformation caused by the outer factor, the diameter d0 of each of the conductive particles is multiplied by 0.8.

Each of the conductive particles 132 has the metal particle, the plastic particle having the metal layer on the outer surface of the plastic particle or the metal particle having the insulating layer on the outer surface of the metal particle. The metal particle includes nickel (Ni), solder, gold (Ag), etc. The metal layer formed on the plastic particle includes a nickel-silver alloy. The nickel-silver alloy may be plated on the outer surface of the plastic particle. The plastic particle includes polystyrene, epoxy, etc.

$$x-g*+0.8d0<h+g \qquad \text{Equation 5}$$

$$x<h+g+g*-0.8d0=LSL \qquad \text{Equation 6}$$

The equations 5 and 6 represent relationships between the heights of the bumps 120, the mean value of the distances between the bumps 120 and the electrode 110, the arithmetic mean of the heights of the bumps 120, the difference of the heights of the bumps 120 caused by the outer factor, and the Lower Specification Limit, wherein x, g, h, g*, 0.8 do, and LSL denote the heights of the bumps 120, the mean value of the distances between the bumps 120 and the electrode 110, the arithmetic mean of the heights of the bumps 120, the difference of the heights of the bumps 120 caused by outer factor, and the Lower Specification Limit, respectively.

Referring to equations 5 and 6, when g and g* are decreased and d0 is increased, the LSL is decreased so that the failure of the open circuit is decreased. When the difference of the heights of the bumps is increased, the failure of the open circuit is increased.

A normalized failure probability of the open circuit is represented by the following equation 7.

$$Q(x \le LSL) = \int_{-\infty}^{h+g+g*-0.8d0} \frac{1}{\sigma\sqrt{2\pi}} \cdot e^{-\frac{(x-h)^2}{2\sigma^2}} dx \qquad \text{Equation 7}$$

Figure 6:
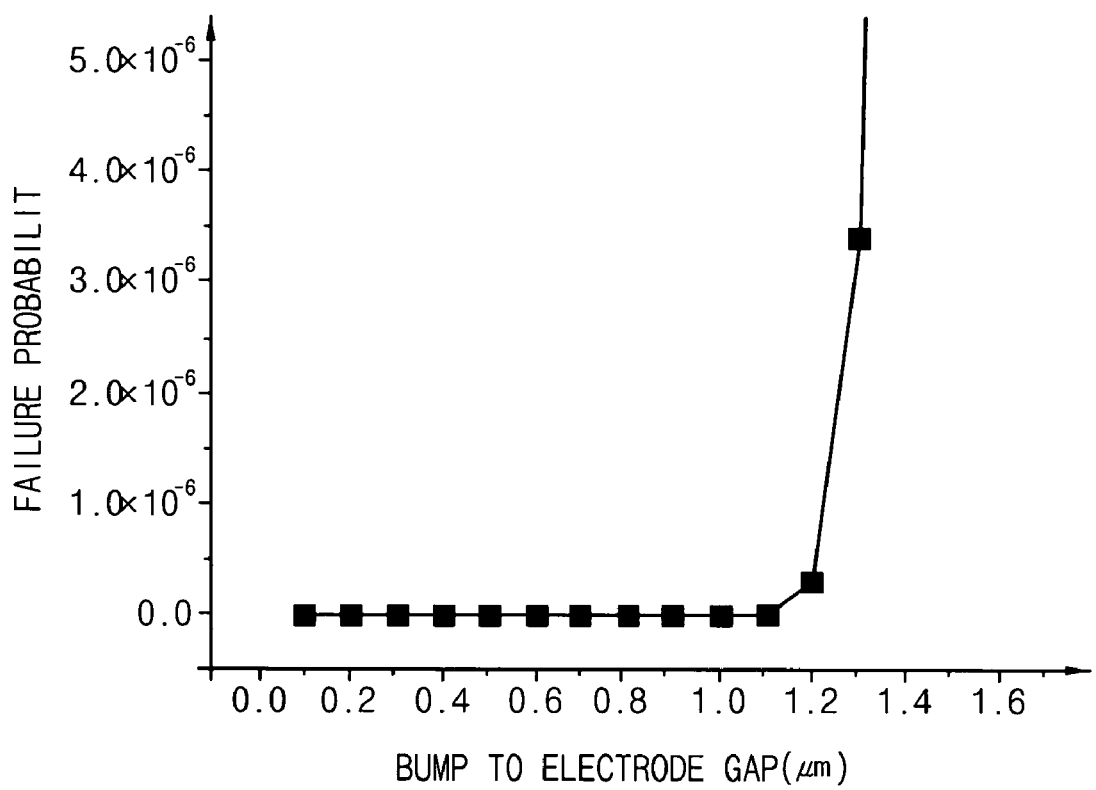
FIG. 6 is a graph showing a relationship between a failure probability of an open circuit and a gap between one of bumps and electrode.

FIG. 6 is a graph showing a relationship between a failure of an open circuit and a gap between one of bumps and electrode. Particularly, the failure of the open circuit was caused by the gap between the bump and the electrode when the diameter of the conductive particles was about 4 μm.

Referring to FIG. 6, when the gap between the bump and the electrode was less than about 1.2 μm, the failure of the open circuit was about zero. In contrast, when the gap between the bump and the electrode was more than or equal to about 1.2 μm, the failure of the open circuit was greatly increased. Particularly, when the gap between the bump and the electrode was about 1.3 μm, the failure of the open circuit was about $3.5*10^{-6}$.

In the present embodiment, the failure was less than equal to about $10^{-6}$, and the gap between the bump and the electrode was less than or equal to about 1.3 μm. Preferably, the gap between the bump and the electrode was less than or equal to about 1.2 μm.

Figure 7:
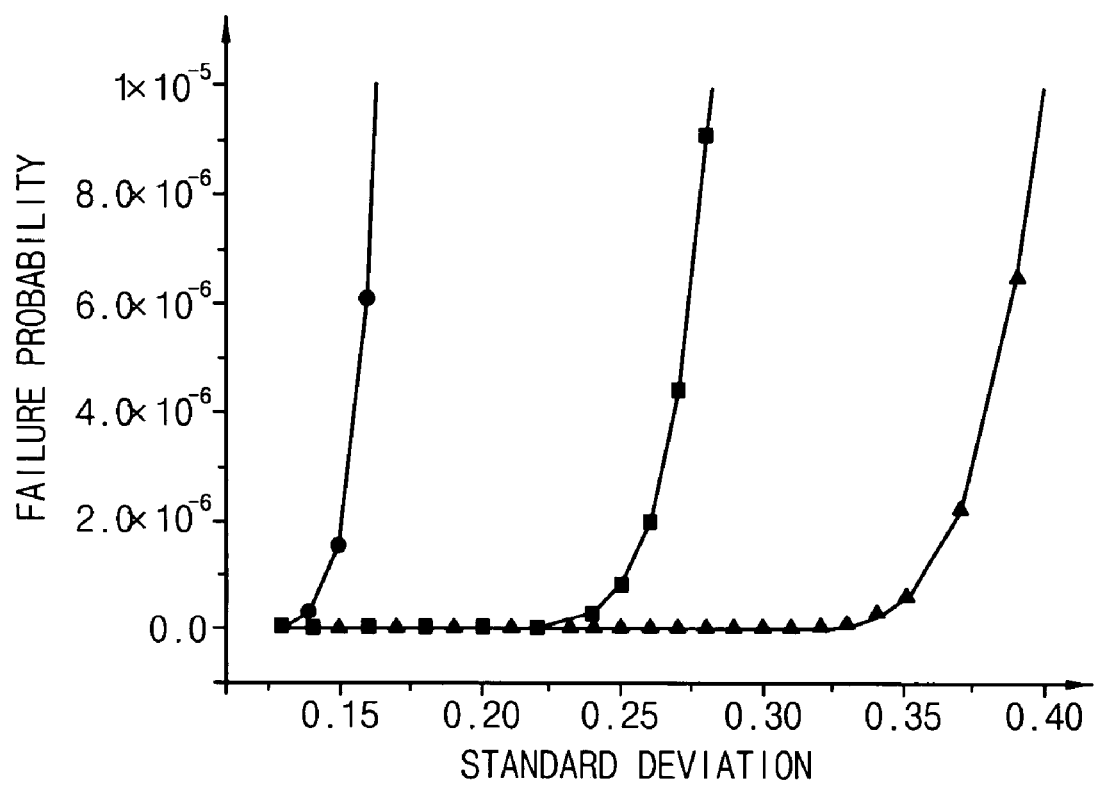
FIG. 7 is a graph showing a relationship between a failure probability of an open circuit and a standard deviation of heights of bumps.

FIG. 7 is a graph showing a relationship between a failure probability of an open circuit and a standard deviation of heights of bumps. The height of each of the bumps, the difference of the heights of the bumps caused by the outer factor, and the diameter of the conductive particles were about 15 μm, about 1 μm and about 4 μm, respectively, When the arithmetic mean of the gap between the bumps 120 and the electrode 110 and the standard deviation of the heights x of the bumps 120 were about 1.5 μm and about 0.15, respectively, the failure probability of the open circuit was defined in FIG. 7. In addition, when the arithmetic mean of the gap between the bumps 120 and the electrode 110 and the standard deviation of the heights x of the bumps 120 were about 1.0 μm and about 0.275, respectively, the failure probability of the open circuit is defined in FIG. 7. Furthermore, when the arithmetic mean of the gap between the bumps 120 and the electrode 110 and the standard deviation of the heights x of the bumps 120 were about 0.5 μm and about 0.15, respectively, the failure probability of the open circuit is defined in FIG. 7.

When the diameter of the conductive particles 132 is decreased, the failure probability of the open circuit is decreased, and an error caused by the difference of the heights of the bumps is increased.

Therefore, the diameter of each of the conductive particles 132 is optimized so that the failure probability of the open circuit is minimized.

Figure 8:
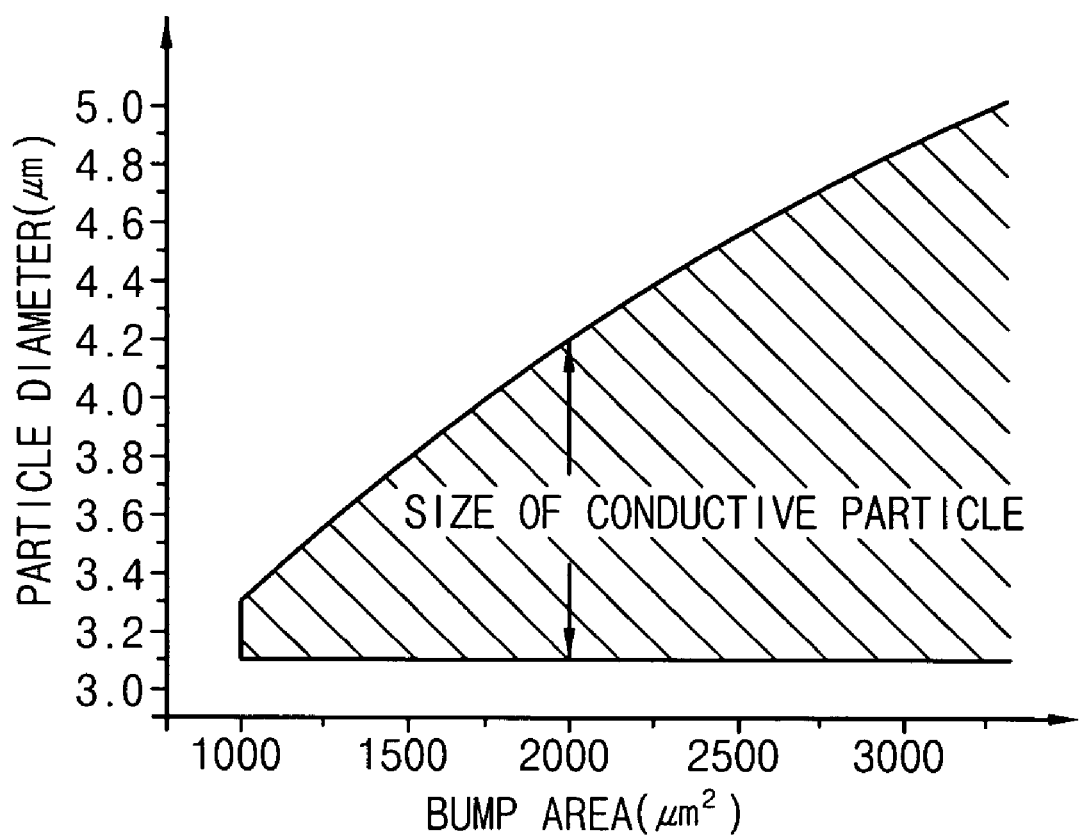
FIG. 8 is a graph showing a relationship between a diameter of conductive particles and an area of bumps.

FIG. 8 is a graph showing a relationship between a diameter of conductive particles and an area of bumps. The failure probability of the open circuit is less than or equal to about 1 ppm. The height of the bumps, the diameter of the conductive particles after compressing the electrode and the bumps, the gap between the bumps and the electrode, and the standard deviation of the heights of the bumps were about 15 μm, about 1 μm, about 1 μm, and about 0.2, respectively.

Referring to FIG. 8, when the area of the bumps was about 1,000 μm² and about 1,500 μm², the diameter of the conductive particles was about 3.1 μm to about 3.3 μm and about 3.1 μm to about 3.8 μm, respectively, so that the failure probability of the open circuit was less than equal to about 1 ppm.

When the area of the bump was about 2,000 μm², about 2,500 μm², and about 3,000 μm², the diameter of the conductive particles was about 3.1 μm to about 4.2 μm, about 3.1 μm to about 4.6 μm, and about 3.1 μm to about 4.8 μm, respectively, so that the failure probability of the open circuit was less than or equal to about 1 ppm.

When the area of bump was about 1,000 μm² to about 2,000 μm², the diameter of the conductive particles was about 3.2 μm to about 4.2 μm. In the present embodiment, the conductive particle was the plastic particle having the metal layer on the outer surface of the plastic particle. Alternatively, the conductive particle may be the metal particle having the insulating layer on the outer surface of the metal particle.

The number of the conductive particles composed in the ACF may be determined based on the diameter of the conductive particles. The ACF includes the resin layer and the conductive particles in the resin layer. In the present embodiment, a volume ratio of a volume of each of the conductive particles to a volume of the resin layer is about 0.1 to about 0.12. The number of the conductive particles is determined by the diameter and the volume ratio.

For example, when the diameter of the conductive particle is about 3.1 μm to about 4.2 μm, the number of the conductive particles formed in the ACF layer is about 4 million to about 7 million per 1 μm³.

When the diameter of each of the conductive particles is about 3.1 μm, the volume of each of the conductive particles is about 15.59 μm³ that is $(4\pi/3)*(1.55 \mu m)^3$. When the volume and the volume ratio of each of the conductive particles to the resin layer are about 15.59 μm³ and about 0.1, respectively, the number of the conductive particles in an 1 mm³ that is about $10^9$ μm³, is about 6,414,368 that is $(10^9/15.59)*0.1$. When the volume and the volume ratio of each of the conductive particles to the resin layer are about 15.59 μm³ and about 0.11, respectively, the number of the conductive particles in an 1 μmm³ that is about $10^9$ μm³, is about 7,055,805 that is $(10^9/15.59)*0.11$.

When the diameter of each of the conductive particles is about 3.5 μm, the volume of each of the conductive particles is about 22.45 μm³ that is $(4\pi/3)*(1.75 \mu m)^3$. When the volume and the volume ratio of each of the conductive particles to the resin layer are about 22.45 μm³ and about 0.12, respectively, the number of the conductive particles in an 1 mm³ that is about $10^9$ μm³, is about 5,345,211 that is $(10^9/22.45)*0.12$.

When the diameter of each of the conductive particles is about 3.8 μm, the volume of each of the conductive particles is about 28.73 μm$^3$ that is $(4\pi/3)*(1.9\,\mu m)^3$. When the volume and the volume ratio of each of the conductive particles to the resin layer are about 28.73 μm$^3$ and about 0.12, respectively, the number of the conductive particles in an 1 mm$^3$ that is about 10$^9$ μm$^3$, is about 4,524,886 that is $(10^9/28.73)*0.13$. Therefore, the size of each of the conductive particles in the ACF layer and the volume distribution of the conductive particles are determined.

In addition, the height of each of the bumps and the interval between the bumps are optimized so that the open circuit caused by the difference of the heights of the bumps is decreased.

According to the present invention, the cause of the open circuit formed in the ACF or the COG is statistically and experimentally analyzed.

That is, the distribution of the conductive particles between the bump of the semiconductor chip and the substrate is analyzed so that the failure probability of the open circuit may be evaluated. In addition, the open circuit caused by the difference of the heights of the bumps is decreased.

Although the embodiment of the present invention have been described, it is understood that the present invention should not be limited to the embodiment but various changes and modifications can be made by one ordinary skilled in the art within the spirit and scope of the present invention as hereinafter claimed.

What is claimed is:

1. An anisotropic conductive film electrically connecting an electrode of a substrate and a bump of a semiconductor chip, the anisotropic conductive film comprising:
   a resin layer; and
   a plurality of conductive particles in the resin layer, a volume ratio of the conductive particles to the resin layer being about 0.1 to about 0.12, a diameter of each of the conductive particles being not less than 3.1 μm and not more than 4.2 μm, a number of the conductive particles per one cubic millimeter (mm$^3$) being about 4 millions to about 7 millions.

2. The anisotropic conductive film of claim 1, wherein an area of the bump is about 1,000 μm$^2$ to about 2000 μm$^2$ 3. The anisotropic conductive film of claim 1, wherein an area of the bump is about 2,000 μm$^2$ to about 3,000 μm$^2$ 4. Bumps formed on a semiconductor chip formed opposite a substrate, wherein the bumps have at least two different heights and are electrically connected to the substrate by an anisotropic conductive film, wherein a standard deviation of heights of the bumps is no more than about 0.25, and heights of the bumps are more than about 13.3 μm.

5. The bumps of claim 4, wherein a diameter of each of the conductive particles is about 3.1 μm to about 4.2 μm, and an area of the bump is about 1,000 μm$^2$ to about 2,000 μm$^2$.

6. A packaging structure of a semiconductor comprising:
   a semiconductor chip including a bump having a height that is more than about 13.3 μm;
   a substrate having an electrode;
   an anisotropic conductive film including a plurality of conductive particles to electrically connect the bump and the electrode, a number of the conductive particles per one cubic millimeter (mm$^3$) being about 4 millions to about 7 millions,
   wherein the bump is formed on the semiconductor chip opposite the substrate; and
   a plurality of bumps having at least two different heights, wherein a standard deviation of heights of the bumps is no more than about 0.25.

7. The packaging structure of claim 6, wherein a diameter of each of the conductive particles is about 3.1 μm to about 4.2 μm, and an area of the bump is about 1,000 μm$^2$ to about 2,000 μm$^2$.

8. The packaging structure of claim 6, wherein a diameter of each of the conductive particles is about 3.5 μm, and an area of the bump is about 1,000 μm$^2$ to about 2,000 μm$^2$.

9. The packaging structure of claim 6, wherein a diameter of each of the conductive particles is no more than about 4.8 μm, and an area of the bump is about 2,000 μm$^2$ to about 3,000 μm$^2$.

10. The packaging structure of claim 6, wherein the anisotropic conductive film comprises:
    a resin layer; and
    the conductive particles in the resin layer, a volume ratio of the conductive particles to the resin layer being about 0.1 to about 0.12, the number of the conductive particles per one cubic millimeter (mm$^3$) being about 4 millions to about 7 millions.

11. The packaging structure of claim 6, wherein the diameter of each of the conductive particles is about 3 μm to about 4 μm.

12. The packaging structure of claim 6, wherein the diameter of each of the conductive particles is about 3.1 μm to about 4.2 μm.

13. The packaging structure of claim 6, wherein an interval between the bump of the semiconductor chip and the electrode of the substrate is limited to less than about 1.3 μm.

14. The anisotropic conductive film of claim 1, wherein an interval between the bump of the semiconductor chip and the electrode of the substrate is limited to less than about 1.3 μm.

15. The bumps of claim 4, wherein an interval between each of the bumps and the electrode of the substrate is limited to less than about 1.3 μm.

* * * * *